(12) United States Patent
Fujii et al.

(10) Patent No.: US 7,173,445 B2
(45) Date of Patent: *Feb. 6, 2007

(54) SENSOR FOR INSPECTION INSTRUMENT AND INSPECTION INSTRUMENT

(75) Inventors: Tatsuhisa Fujii, Hiroshima (JP); Kazuhiro Monden, Hiroshima (JP); Mikiya Kasai, Hiroshima (JP); Shogo Ishioka, Hiroshima (JP); Shuji Yamaoka, Hiroshima (JP)

(73) Assignee: OHT Inc., Hiroshima (JP)

( * ) Notice: Subject to any disclaimer, the term of this patent is extended or adjusted under 35 U.S.C. 154(b) by 125 days.

This patent is subject to a terminal disclaimer.

(21) Appl. No.: 10/487,828

(22) PCT Filed: Aug. 27, 2002

(86) PCT No.: PCT/JP02/08599

§ 371 (c)(1),
(2), (4) Date: Feb. 27, 2004

(87) PCT Pub. No.: WO03/019210

PCT Pub. Date: Mar. 6, 2003

(65) Prior Publication Data

US 2004/0241887 A1 Dec. 2, 2004

(30) Foreign Application Priority Data

Aug. 27, 2001 (JP) .............................. 2001-255621

(51) Int. Cl.
G01R 31/00 (2006.01)
G01R 31/28 (2006.01)

(52) U.S. Cl. .................... 324/765; 324/158.1; 324/770

(58) Field of Classification Search .................... None
See application file for complete search history.

(56) References Cited

U.S. PATENT DOCUMENTS 2,959,681 A * 11/1960 Noyce ........................ 257/539
6,097,202 A *  8/2000 Takahashi ................... 324/761
6,614,250 B1 *  9/2003 Odan et al. ................. 324/765

(Continued)

FOREIGN PATENT DOCUMENTS

JP          11-153638          6/1999

(Continued)

*Primary Examiner*—Paresh Patel
*Assistant Examiner*—Roberto Velez
(74) *Attorney, Agent, or Firm*—Westerman, Hattori, Daniels & Adrian, L.L.P.

(57) ABSTRACT

Disclosed is an inspection sensor and inspection apparatus capable of accurately inspecting the shape of a conductive pattern. A sensor element 12a includes an MOSFET, and an aluminum electrode (AL) serving as a passive element 80. The passive element or aluminum electrode 80 is connected to the gate of a MOSFET 81 and the source of a MOSFET 82. A voltage VDD is supplied from a power supply circuit 18 to the drain of the MOSFET 81, and the source of the MOSFET 81 is connected to the drain of a MOSFET 83. A reset signal is entered from a vertical selection section 14 into the gate of the MOSFET 82, and the voltage VDD is supplied from the power supply circuit 18 to the drain of the MOSFET 82. A selection signal is entered from the vertical selection section 14 into the gate of the MOSFET 83, and an output from the source of the MOSFET 83 is entered into a lateral selection section 13.

8 Claims, 9 Drawing Sheets

U.S. PATENT DOCUMENTS

| | | | |
|---|---|---|---|
| 6,734,692 B2 * | 5/2004 | Fujii et al. | 324/763 |
| 6,798,453 B1 * | 9/2004 | Kaifu | 348/304 |
| 2002/0135390 A1 | 9/2002 | Fujii et al. | 324/761 |
| 2002/0140442 A1 | 10/2002 | Ishioka et al. | 324/750 |
| 2002/0140448 A1 | 10/2002 | Fujii et al. | 324/761 |
| 2003/0117164 A1 | 6/2003 | Fujii et al. | 324/770 |

FOREIGN PATENT DOCUMENTS

| | | |
|---|---|---|
| JP | 2001-221824 | 8/2001 |
| JP | 2001-272430 | 10/2001 |
| JP | 2002-22789 | 1/2002 |
| WO | WO 01/63307 | 8/2001 |

* cited by examiner

SENSOR FOR INSPECTION INSTRUMENT AND INSPECTION INSTRUMENT

TECHNICAL FIELD

The present invention relates to an inspection apparatus for a conductive pattern of a circuit board and to a sensor for the inspection apparatus.

BACKGROUND ART

In manufacturing processes of a circuit board, it is required to inspect the presence of disconnection and/or short-circuit in conductive patterns formed on a circuit board.

As to a technique for inspecting a conductive pattern, there has been known a contact type inspection technique comprising bringing two pins into contact, respectively, with both ends of a conductive patter, supplying an electrical signal from one of the pins, and receiving the electrical signal by the other pin to inspect the presence of disconnection or the like in the conductive pattern.

The recent progressive densification of conductive patterns causes difficulties in assuring a sufficient space for simultaneously arranging a plurality of pins, respectively, at the ends of adjacent conductive patterns and bringing the pins into contact with the corresponding ends of the conductive patterns. In view of such circumstances, there has been proposed a non-contact type inspection technique allowing electric signals from conductive patterns to be received in a non-contact manner without using any pin (see Japanese Patent Laid-Open Publication No. Hei 9-264919).

As is shown in FIG. 8, this non-contact type inspection technique comprises bringing a pin into contact with one of the ends of a specific conductive pattern or circuit wiring to be inspected (hereinafter referred to as "target conductive pattern" or "target circuit wiring"), placing a sensor conductor at the other end of the target conductive pattern in non-contact manner, supplying an inspection signal from the pin, and detecting potential variation in conductive pattern using the sensor conductor to inspect the presence of disconnection or the like in the target conductive pattern. More specifically, as shown in FIG. 9 representing an equivalent circuit thereof, disconnection and/or short-circuit in the conductive pattern opposed to the sensor conductor are detected based on the magnitude of an amplified current obtained by amplifying a current generated on the sensor conductor using an amplifier circuit.

In the above conventional non-contact inspection technique, an electromagnetic wave from a conductive pattern has been received by an electrode having a size covering over a plurality of pattern lines on a typical printed circuit board. Thus, it has been impossible to inspect a circuit pattern in the level of 50 μm with a high degree of resolution, and to detect a chipping in a conductive pattern even if it has a relatively large size.

DISCLOSURE OF THE INVENTION

In order to solve the above problems of the conventional techniques, it is therefore an object of the present invention to provide an inspection apparatus capable of accurately inspecting the shape of a conductive pattern, and a sensor for use in the inspection apparatus.

In order to achieve the above object, according to a first aspect of the present invention, there is provided a sensor for used in inspecting a conductive pattern of a circuit board. The sensor comprises a plurality of sensor elements for detecting in a non-contact manner potential variation which is generated in the conductive pattern in response to an inspection signal supplied to the conductive pattern. Each of the sensor element includes a passive element composed of a metal electrode which is formed on a semiconductor single-crystal to serve as a counter electrode for achieving a capacitive coupling with the conductive pattern to detect the potential variation in the conductive pattern, and a transistor operable, in response to a selection signal, to output a detection signal generated in the passive element.

Further, according to a second aspect of the present invention, there is provided an inspection apparatus for inspecting a conductive pattern of a circuit board. This inspection apparatus comprises detecting means for detecting potential variation which is generated in each portion of the conductive pattern in response to an inspection signal supplied to the conductive pattern, by use of a plurality of sensor elements, and selecting means for outputting a select signal for selecting one or more of the sensor elements. The sensor elements are formed on a semiconductor single-crystal or on a flat plate, and each of the sensor elements includes a passive element having a metal electrode structure which serves as a counter electrode for achieving a capacitive coupling with the conductive pattern to detect the potential variation in the conductive pattern, and a transistor operable, in response to the selection signal, to output a detection signal generated in the passive element.

In the inspection sensor or inspection apparatus set forth in the first or second aspect of the present invention, the transistor may be a current-readout MOSFET. In this case, the selection signal may be entered into the gate of the MOSFET to obtain the detection signal from the drain of the MOSFET.

Alternatively, the transistor may be a current-readout thin-film transistor. In this case, the passive element may be connected to the source of the thin-film transistor, and the selection signal may be entered into the gate of the thin-film transistor to obtain the detection signal from the drain of the thin-film transistor.

Still alternatively, the transistor may be first and second MOSFETs which are connected in series with each other. In this case, the first MOSFET may have a gate connected with the passive element, and a source whose potential is varied according to a potential of the passive element applied to the gate, and the second MOSFET may have a gate connected with the selection signal. Further, the second MOSFET may be operable, in response to the selection signal, to receive the potential of the source of the first MOSFET by its drain, and output the received potential from its source as the detection signal.

In the inspection sensor or inspection apparatus set forth in the first or second aspect of the present invention, the sensor elements may be formed on a sensor chip in a matrix arrangement.

BEST MODE FOR CARRYING OUT THE INVENTION

With reference to the drawings, an embodiment of the present invention will now be described in detail. While the following description is made in connection with a specific embodiment, the present invention is not limited to any structures, arrangements of components and numerical values of the specific embodiments, unless otherwise specified.

As one embodiment of the present invention, an inspection apparatus using a MOSFET as a sensor element will be described below.

Figure 1:
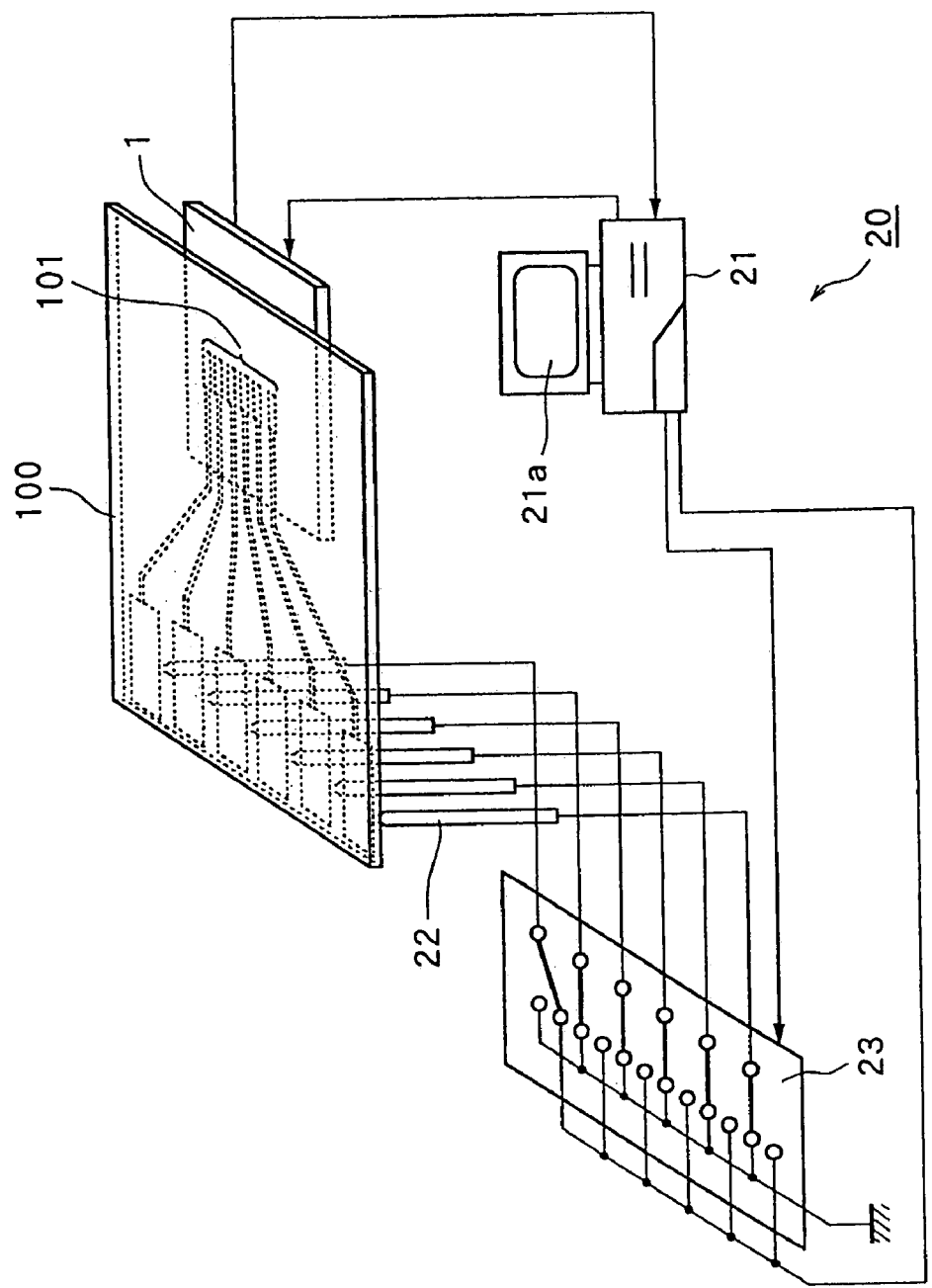
FIG. 1 is a schematic diagram of an inspection system incorporating an inspection apparatus according to one embodiment of the present invention.

Referring to FIG. 1, an inspection system incorporating the inspection apparatus according to one embodiment of the present invention will first be schematically described.

In FIG. 1, the inspection system generally designated by the reference numeral 20 is designed to inspect a plurality of conductive patterns 101 formed on a circuit board 100. The inspection system 20 comprises an inspection apparatus 1, a computer 21, a plurality of probes 22 for supplying an inspection signal to the conductive patterns 101, and a selector 23 for switchingly selecting at least one of the probes 22 to be supplied with the inspection signal.

For example, the selector 23 may be composed of a multiplexer or a duplexer.

The computer 21 is operable to supply to the selector 23 a control signal for selecting at least one of the probes 22 and an inspection signal to be supplied to at least one of the conductive patterns 101 through the proves 22.

The computer 21 is also operable to supply to the inspection apparatus 1 a synchronization signal for allowing the inspection apparatus to be operated in synchronous with the control signal supplied to the selector 23. Further, the computer 21 is operable, in response to the receiving of a detection signal from the inspection apparatus 1, to create image data corresponding to the shape of the conductive pattern 101. Then, disconnection, short-circuit and/or chipping in the conductive pattern is detected based on the created image data.

Further, the computer 21 has a function of displaying an image of a target conductive pattern on a display 21a of the computer 21 based on a detection signal from a plurality of sensor elements 12a of the inspection apparatus 1, During an inspection operation, each of the probes 22 is arranged such that the tip of the probe 22 is brought into contact with one (e.g. input/output end) of the ends of the associated conductive pattern 101 on the circuit board 100. Then, an inspection signal is supplied to the probe 22 selected by the selector 23, and the selected prove 22 supplies the inspection signal to the conductive pattern 101 in contact with the selected prove 22.

The selector 23 is operable to select at least one of the probes 22 to be supplied with an inspection signal and the remaining probes 22 to be brought to the ground level, in accordance with the control signal supplied from the computer 21, and connect these probes to the computer 21. In this manner, an inspection signal from the computer 21 is supplied to at least one conductive pattern selected from the plurality of individual conductive patterns 101 on the circuit board 100.

The inspection apparatus 1 according to one embodiment of the present invention is disposed at a position opposed to the target conductive pattern 101 on the circuit board 100 in a non-contact manner to detect potential variation which is generated in the target conductive pattern 101 in response to an inspection signal supplied from the probe 22, and then output the detected potential variation to the computer 21 as a detection signal.

The distance between the inspection apparatus 1 and the target conductive pattern is preferably set at 0.5 mm or less. More preferably, it is set at 0.05 mm or less to provide an optimal detection result.

While the conductive patterns 101 of the circuit board 100 of FIG. 1 are formed on only one of the side surfaces of the circuit board 100, the inspection system according to this embodiment can also inspect a circuit board having the conductive pattern 101 formed on both side surfaces thereof. In this case, the inspection operation may be performed by preparing two of the inspection apparatuses 1 and locating them on the upper and lower sides of the circuit board to sandwich the circuit board there between, so as to inspect both the conductive patterns 101 on the upper and lower side surfaces of the circuit board all at once. Alternatively, the inspection operation may be performed by inspecting one of the side surfaces of the circuit board and then rotatably moving the circuit board to a position where the other side surface of the circuit board is disposed opposed to the inspection apparatus, or by inspecting one of the side surfaces of the circuit board and then rotatably moving the inspection apparatus to a position where the inspection apparatus is disposed opposed to the other side surface of the circuit board.

Figure 2:
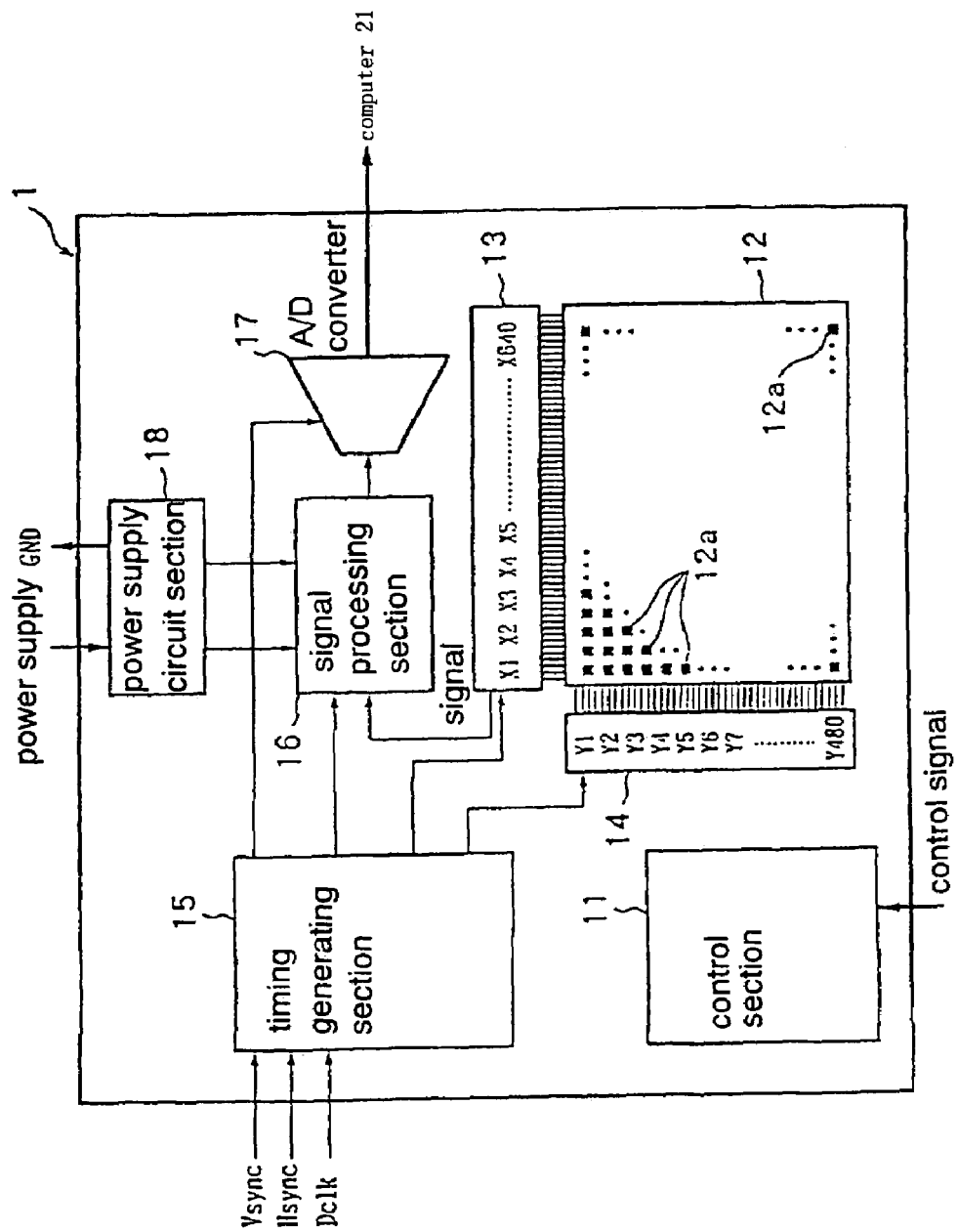
FIG. 2 is a block diagram showing an electrical configuration of an inspection apparatus according to one embodiment of the present invention.

With reference to FIG. 2, the electrical configuration of the inspection apparatus 1 will be described below. The inspection apparatus 1 is constructed by mounting a sensor chip having the electrical configuration as shown in FIG. 2 on the surface of a package (not shown).

The inspection apparatus 1 comprises a control section 11, a sensor element group 12 including a plurality of sensor elements 12a, a vertical selection section 14 for selecting at least one of the rows of the sensor elements 1 2a, a lateral selection section 13 for selecting at least one of the columns of the sensor elements 12a and extracting a signal therefrom, a timing generating section 15 for generating a selection signal for selecting at least one of the sensor elements 12a, a signal processing section 16 for processing the signal from the lateral selection section 13, an A/D converter 17 for A/D converting the processed signal from the signal processing section 16, and a power supply circuit 18 for supplying a power for driving the inspection apparatus 1.

The control section 11 is operable to control the operation of the inspection apparatus 1 based on a control signal from the computer 21. The sensor elements 12a are formed in a matrix arrangement (480 pieces in each column×640 pieces in each row), and designed to detect in a non-contact manner potential variation which is generated in the conductive pattern 101 in response to an inspection signal supplied from the probe 22 to the conductive pattern 101.

The timing generating section 15 is operable, in response to a vertical synchronization signal (Vsync), a horizontal synchronization signals (Hsync), and a reference signal (Dclk) which are supplied from the computer 21, to supply a timing signal for selecting at least one of the sensor elements 12a, respectively, to the vertical selection section 14 and the lateral selection section 13.

According to the timing signal from the timing generating section 15, the vertical selection section 14 selects at least one of the rows of the sensor element group 12 in a sequential order. Detection signals are simultaneously output from the sensor elements 12a in the row selected by the vertical selection section 14, and entered into the lateral selection section 13. The analog detection signals are supplied to the lateral selection section 13 through 640 terminals, and amplified and temporarily held by the lateral selection section 13. In response to the timing signal from the timing generating section 15, the lateral selection section 13 sequentially sends the detection signals to the signal processing section 16 through a select circuit composed of a multiplexer or the like.

The signal processing section 16 performs an analog signal conditioning to the detection signal from the lateral selection section 13, and then sends the analog detection signal to the A/D converter 17.

The A/D converter 17 converts the analog detection signal from the signal processing section 16 into a digital signal, for example, of 8-bit, and then outputs the digital detection signal.

While the inspection apparatus 1 according to this embodiment incorporates the A/D converter, the analog signal subjected to the analog signal conditioning in the signal processing section may be sent directly to the computer 21.

The operation of the sensor element 12a will be described will reference to FIG. 3.

The sensor element 12a includes a metal electrode, such as an aluminum electrode (AL), serving as a passive element 80 formed on a semiconductor single-crystal substrate 84. As compared to a sensor element using a semiconductor electrode, the sensor element 12a using the metal electrode can have a larger capacitance with the conductive pattern 101.

Specifically, the semiconductor electrode has to be formed in a substrate at a relatively large thickness (depth from the surface of the substrate) and has a relatively high resistance, resulting in reduced capacitance between a circuit wiring and the electrode. By contrast, the metal electrode has an extremely low resistance, and can have a plat-plate shape with a thin thickness. Thus, the capacitance between a circuit wiring and the metal electrode can be increased to provide enhanced sensitivity in the sensor element.

The metal electrode may be made of chromium, copper or polysilicon as well as aluminum.

The metal electrode 80 serving as a passive element is connected to the gate of a MOSFET 81 and the source of a MOSFET 82. A voltage VDD is supplied from the power supply circuit 18 to the drain of the MOSFET 81, and the source of the MOSFET 81 is connected to the drain of a MOSFET 83. A reset signal is entered from the vertical selection section 14 into the gate of the MOSFET 82, and the voltage VDD is supplied from the power supply circuit 18 to the drain of the MOSFET 82. A selection signal is entered from the vertical selection section 14 into the gate of the MOSFET 83, and an output from the source of the MOSFET 83 is entered into the lateral selection section 13.

Figure 4:
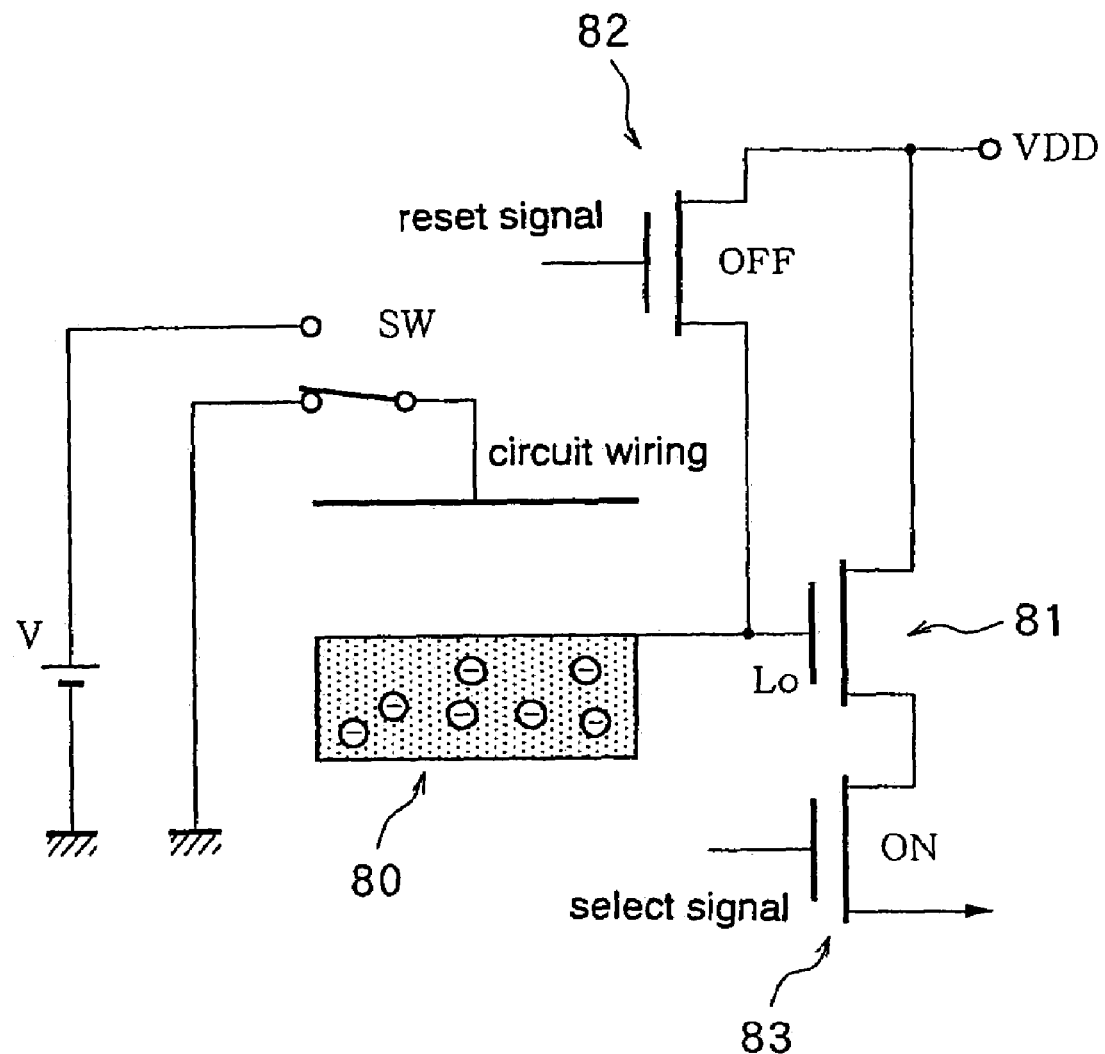
FIG. 4 is an explanatory diagram of a principle allowing a sensor element of a sensor according to one embodiment of the present invention to generate a voltage in response to potential variation in a conductive pattern.
Figure 5:
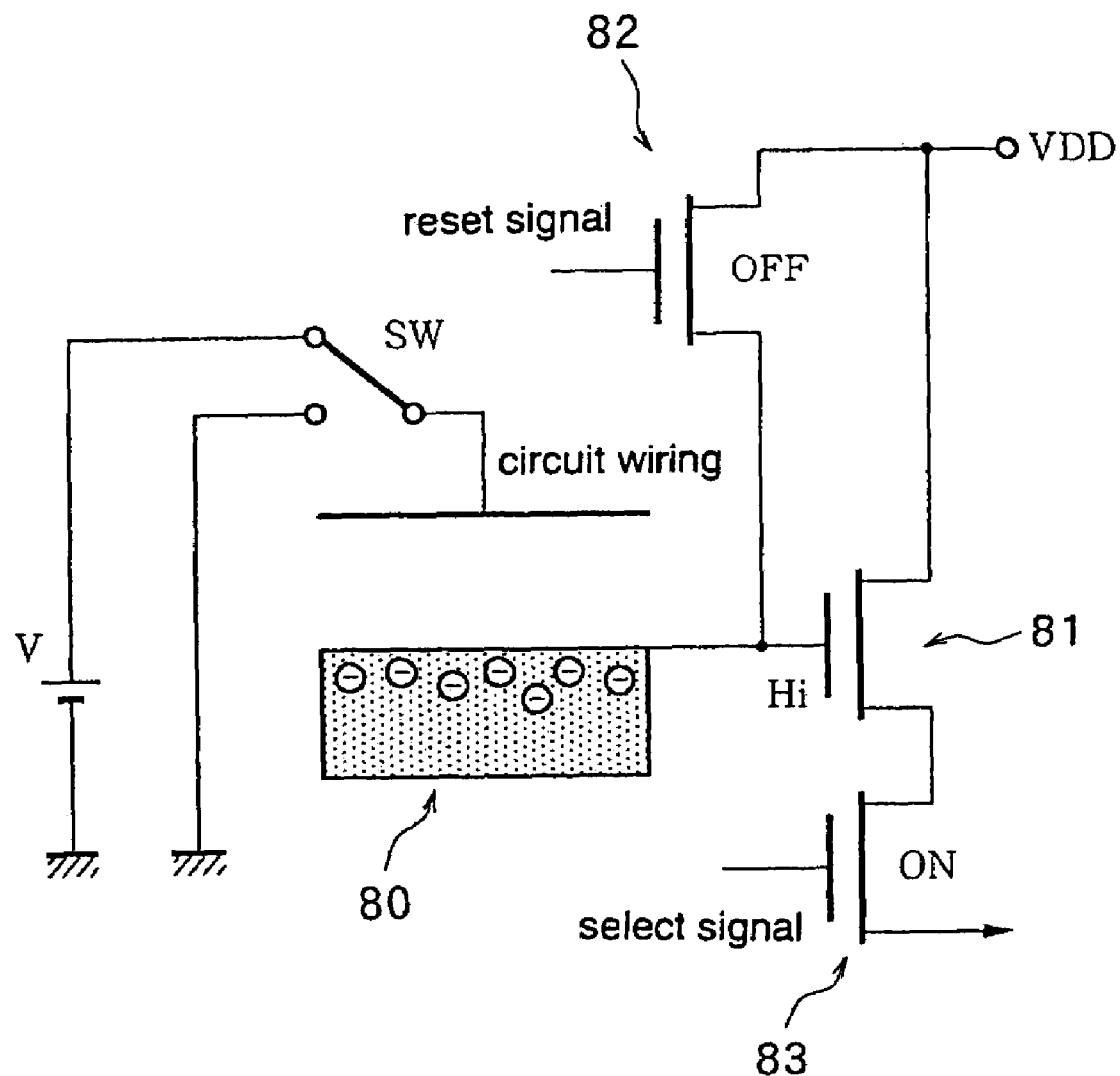
FIG. 5 is an explanatory diagram of a principle of allowing a sensor element of a sensor according to one embodiment of the present invention to generate a voltage in response to potential variation in a conductive pattern.

A principle allowing the potential variation of the conductive pattern 101 detected by the passive element 80 to be converted into an output voltage from the source of the MOSFET 83 will be described in detail. FIGS. 4 and 5 are explanatory schematic model diagrams of this principle. FIG. 4 shows the state when no voltage is supplied to a circuit wiring or a conductive pattern, and FIG. 10 shows the state when a certain voltage is supplied to the circuit wiring. Both of these figures are shown in the state when the selection signal is entered into the gate of the MOSFET 83 to turn on the gate.

As shown in FIG. 5, if no voltage is supplied to the circuit wiring, electrons within the passive element 80 are confined within a potential well of a diffusion layer, and thereby a voltage Lo is applied to the gate of the MOSFET 81. Then, a potential lower than that of the gate of the MOSFET 81 by a threshold voltage of the MOSFET 81 is output from the source of the MOSFET 81 performing a source follower operation.

As shown in FIG. 5, when a voltage V is supplied to the circuit wiring, the electrons in the passive element 80 opposed to the circuit wiring tend to gather on the surface of the passive element 80 by the influence of the potential variation in the circuit wiring. In this process, the surface potential of the passive element 80 is reduced, or the potential difference in the passive element 80 is increased because no electron additionally flows into the passive element 80, and the originally existing electrons are concentrated near the surface of the passive element 80. The gate of the MOSFET 81 is connected to the surface of the passive element 80 or the metal electrode, and thereby a voltage Hi is applied to the gate of the MOSFET 81. While a potential lower than that of the gate of the MOSFET 81 by a threshold voltage of the MOSFET 81 is output from the source of the MOSFET 81 performing a source follower operation, the source of the MOSFET 81 outputs a higher voltage than that when no voltage is supplied to the circuit wiring.

When the circuit wiring is connected to the ground again, the electrons within the passive element 80 are dispersed again, and the potential at the gate of the MOSFET 81 becomes Lo.

Figure 6:
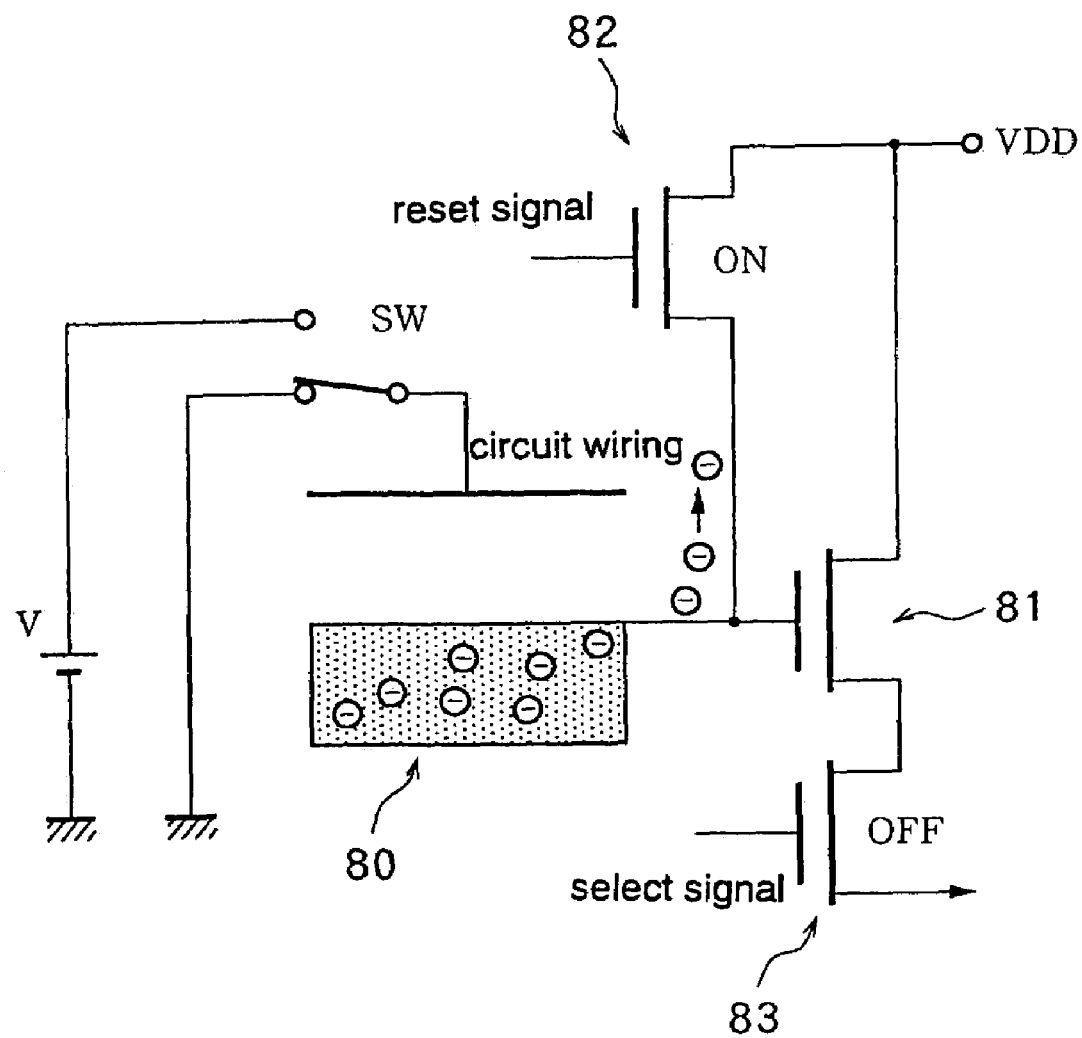
FIG. 6 is an explanatory model diagram of the operation of the sensor element in response to the input of a reset signal.

In this manner, the entire charge in the passive element 80 is theoretically not changed only by on-off switching the voltage to the circuit wiring. However, in practice, some electrons occasionally intrude from the surroundings of the passive element 80. If such a situation is left as it is, the potential of the passive element will in increased without any voltage applied to the circuit wiring, and the potential difference or voltage will be reduced. This means that the-noise potential caused by the above noise electrons is superposed on a receive signal from the circuit wiring as an offset potential, and thereby the received signal is temporarily varied. From this point of view, as shown in FIG. 6, a reset signal is entered into the gate of the MOSFET 82 to allow the passive element 80 to be connected to the power supply so as to release surplus electrons in the passive element 80 to keep the potential of the passive element 80 at a constant value.

Figure 3:
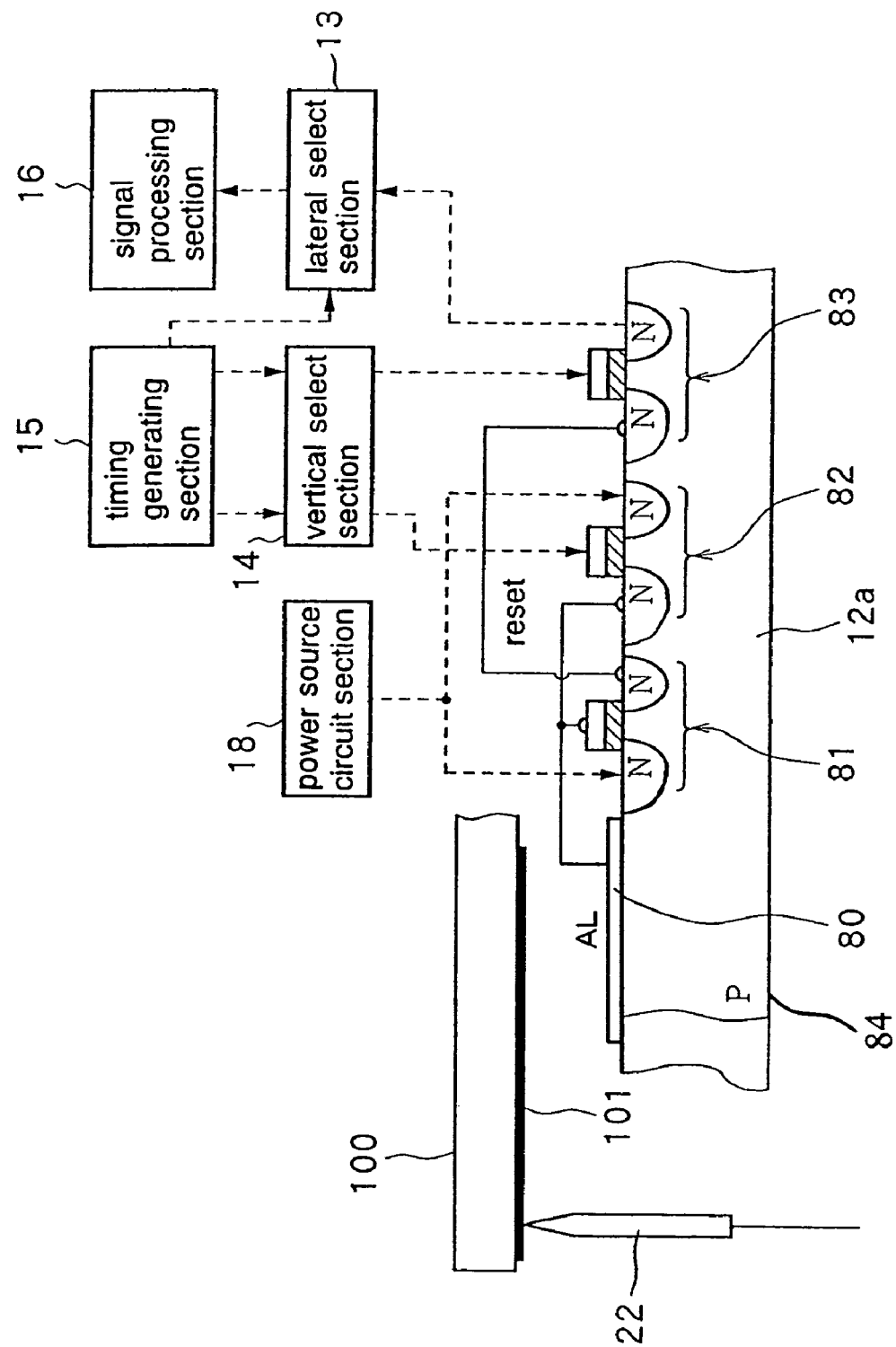
FIG. 3 is an explanatory diagram of the configuration of a sensor element of a sensor according to one embodiment of the present invention.
Figure 7:
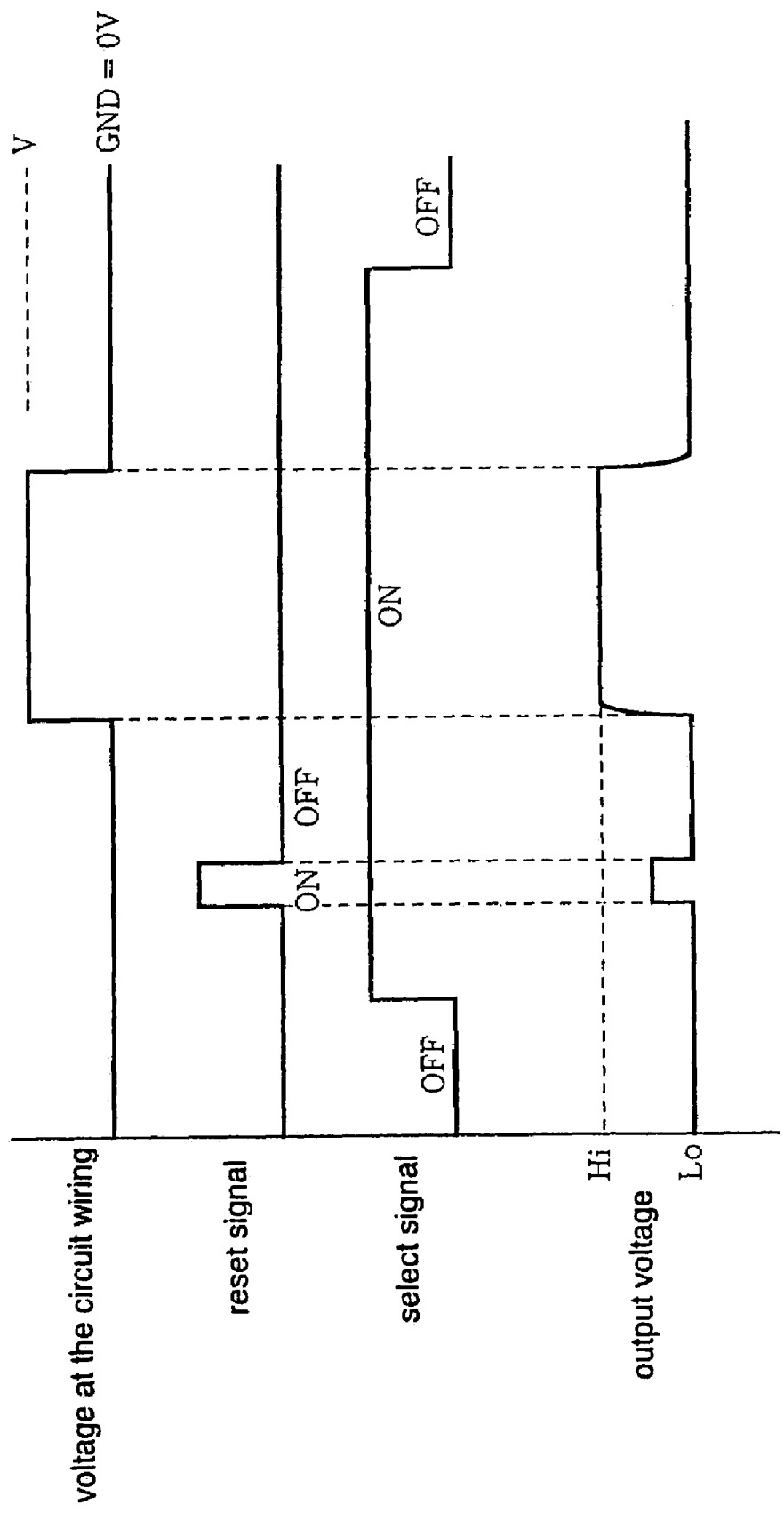
FIG. 7 is a timing chart showing input/output timings of the sensor element.
Figure 8:
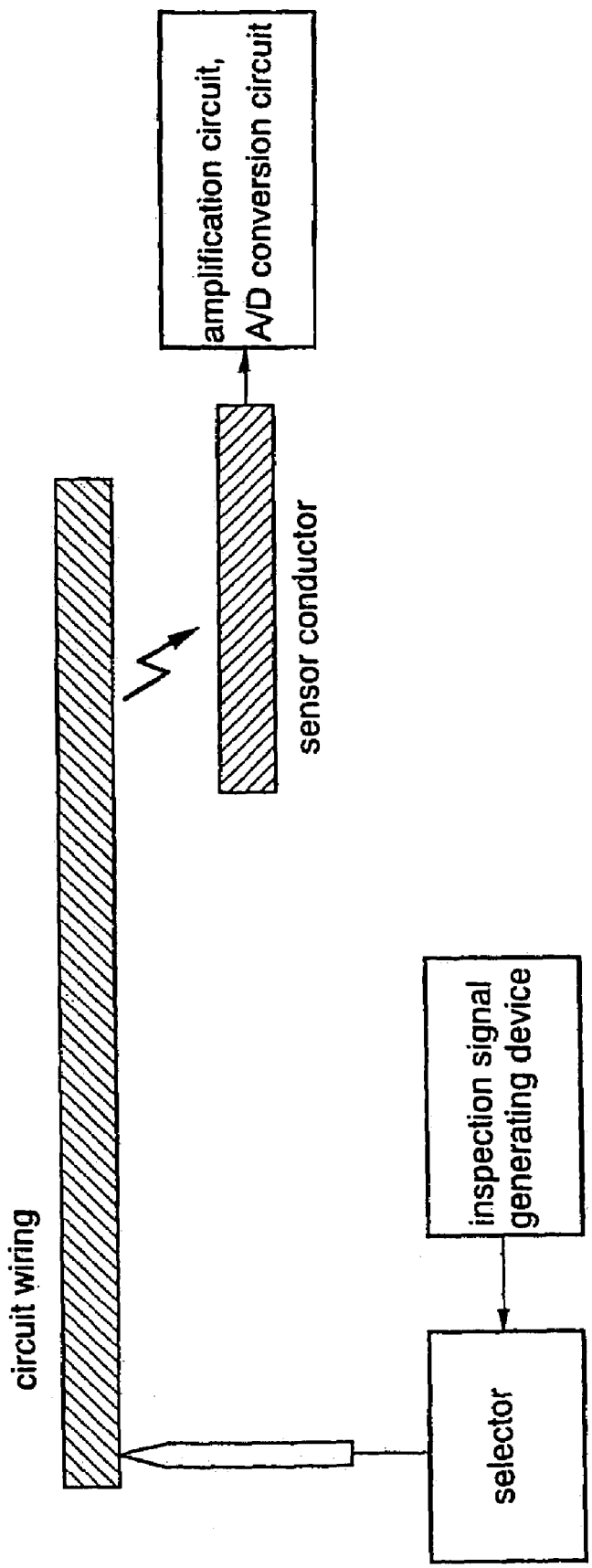
FIG. 8 is an explanatory diagram of a conventional circuit-board inspection apparatus.
Figure 9:
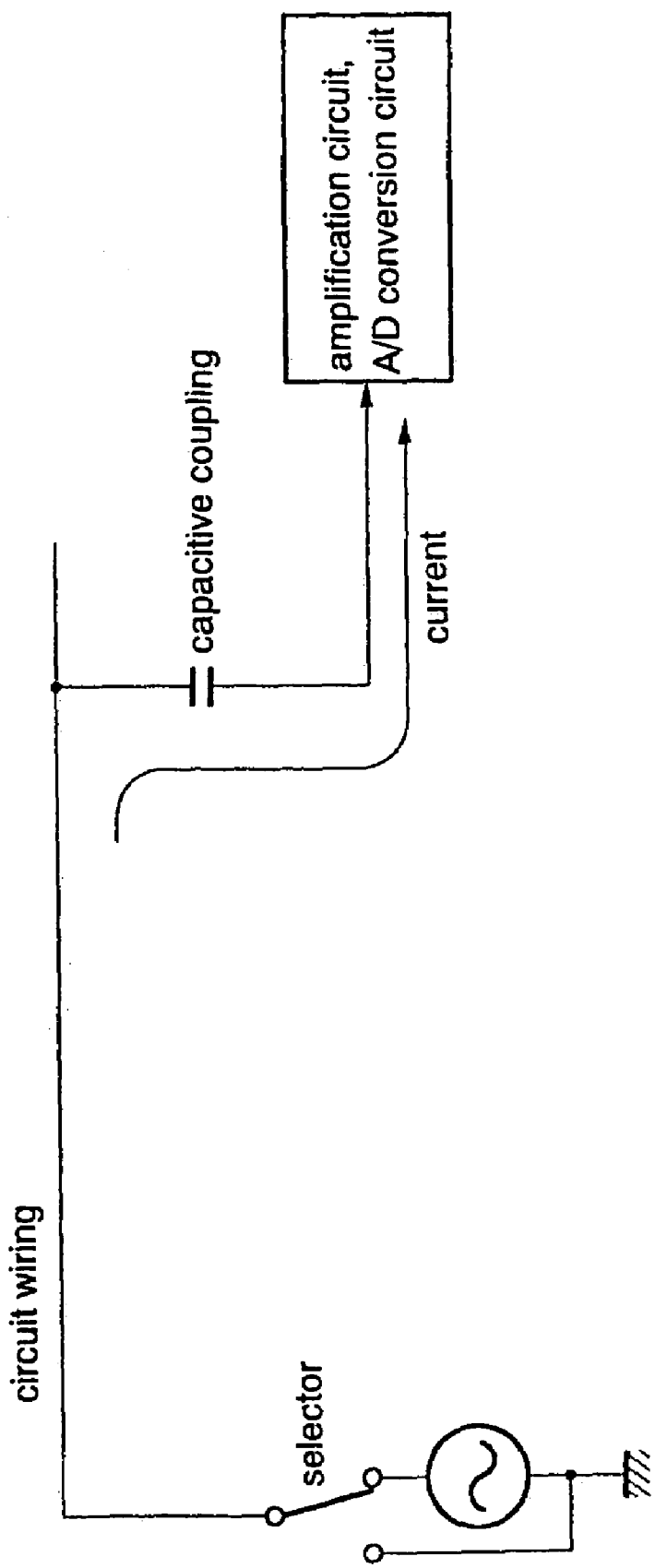
FIG. 9 is an explanatory diagram of a conventional circuit-board inspection apparatus.

FIG. 7 is a timing chart showing input/output timings for a sensor element of a sensor according to one embodiment of the present invention, wherein the sensor element includes the passive element 80, or metal electrode, and the MOSFET circuit as shown in FIG. 3.

As shown in FIG. 7, a selection signal is turned on, and then a reset signal is turned on for a given time period to suppress the temporal variation in the potential of the passive element 80. At this time, the potential at the gate of the MOSFET 81 is increased, and the output voltage from the drain of the MOSFET 83 is slightly increased. This is referred to as a coupling noise of the reset signal. After turning off the reset signal, a voltage V is applied to the circuit wiring. When this output voltage is supplied to the circuit wiring, the output voltage from the drain of the MOSFET 83 becomes the voltage Hi. Thus, it can be recognized that the circuit wiring exists at the position opposed to the sensor element 12*a*.

In order not to erroneously detect the coupling noise as the output voltage, the timing for detecting the output voltage is suitably adjusted or the output voltage is filtered with a high-pass filter.

As described above, according to the above embodiment, as compared to a semiconductor electrode having difficulties in increasing the capacitance between a circuit wiring and the electrode because it has to be formed in a substrate at a relatively large thickness (depth from the surface of the substrate) and has a relatively high resistance, the sensor element using the metal electrode has an extremely low resistance, and can suppress the attenuation in capacitance. Further, the metal electrode can have a plat-plate shape with a thin thickness, and thus the capacitance between a circuit wiring and the metal electrode can be increased to provide enhanced (e.g. about 5 times) sensitivity in the sensor element.

The input timing of the reset signal is not limited to the timing in FIG. 7, and any other suitable timing may be used according to need.

INDUSTRIAL APPLICABILITY

The present invention can provide a sensor and inspection apparatus capable of accurately inspecting the shape of a conductive pattern.

What is claimed is:

1. A sensor for inspecting a conductive pattern of a circuit board, comprising:
    a plurality of sensor elements for detecting in a non-contact manner potential variation which is generated in said conductive pattern in response to an inspection signal supplied to said conductive pattern, each of said sensor elements including:
    a passive element composed of a metal electrode which is formed on a semiconductor single-crystal to serve as a counter electrode for achieving a capacitive coupling with said conductive pattern to detect the potential variation in said conductive pattern, and
    a transistor operable, in response to a selection signal, to output a detection signal generated in said passive elements,
    wherein said transistor is first and second MOSFETs which are connected in series with each other,
    wherein said first MOSFET has a gate connected with said passive element, and a source whose potential is varied according to a potential of said passive element applied to said gate, and
    said second MOSFET has a gate connected with said selection signal,
    wherein said second MOSFET is operable, in response to said selection signal, to receive the potential of said source of said first MOSFET by its drain, and output said received potential from its source as said detection signal.

2. The sensor as defined in claim 1, wherein said transistor is a current-readout MOSFET, wherein said selection signal is entered into the gate of said MOSFET to obtain said detection signal from the drain of said MOSFET.

3. The sensor as defined in claim 1, wherein said transistor is a current-readout thin-film transistor, wherein said passive element is connected to the source of said thin-film transistor, wherein said selection signal is entered into the gate of said thin-film transistor to obtain said detection signal from the drain of said thin-film transistor.

4. The sensor as defined in any one of claims 1–3, wherein said sensor elements are formed on a sensor chip in a matrix arrangement.

5. An inspection apparatus for inspecting a conductive pattern of a circuit board, comprising:
    detecting means for detecting potential variation which is generated in each portion of said conductive pattern in response to an inspection signal supplied to said conductive pattern, by use of a plurality of sensor elements; and
    selecting means for outputting a select signal for selecting one or more of said sensor elements,
    wherein said sensor elements are formed on a semiconductor single-crystal or on a flat plate, and
    each of said sensor elements includes;
    a passive element having a metal electrode structure which serves as a counter electrode for achieving a capacitive coupling with said conductive pattern to detect the potential variation in said conductive pattern, and
    a transistor operable, in response to said selection signal, to output a detection signal generated in said passive elements,
    wherein said transistor is first and second MOSFETs which are connected in series with each other,
    wherein said first MOSFET has a gate connected with said passive element, and a source whose potential is varied according to a potential of said passive element applied to said gate, and
    said second MOSFET has a gate connected with said selection signal,
    wherein said second MOSFET is operable, in response to said selection signal, to receive the potential of said source of said first MOSFET by its drain, and output said received potential from its source as said detection signal.

6. The inspection apparatus as defined in claim 5, wherein said transistor is a current-readout MOSFET, wherein said selection signal is entered into the gate of said MOSFET to obtain said detection signal from the drain of said MOSFET.

7. The inspection apparatus as defined in claim 5, wherein said transistor is a current-readout thin-film transistor, wherein said passive element is connected to the source of said thin-film transistor, wherein said selection signal is entered into the gate of said thin-film transistor to obtain said detection signal from the drain of said thin-film transistor.

8. The inspection apparatus as defined in any one of claims 5–7, wherein said sensor elements are formed on a sensor chip in a matrix arrangement.

* * * * *